(12) United States Patent
Shao

(10) Patent No.: US 10,644,499 B2
(45) Date of Patent: May 5, 2020

(54) CURRENT LIMITER

(71) Applicant: NXP B.V., Eindhoven (NL)

(72) Inventor: Bin Shao, Phoenix, AZ (US)

(73) Assignee: NXP B.V., Eindhoven (NL)

( * ) Notice: Subject to any disclaimer, the term of this patent is extended or adjusted under 35 U.S.C. 154(b) by 323 days.

(21) Appl. No.: 15/710,829

(22) Filed: Sep. 21, 2017

(65) Prior Publication Data

US 2019/0089149 A1    Mar. 21, 2019

(51) Int. Cl.

| H02H 9/02 | (2006.01) |
|---|---|
| H03K 5/08 | (2006.01) |
| G01R 19/165 | (2006.01) |
| H02M 1/32 | (2007.01) |
| H02H 1/00 | (2006.01) |
| H02M 3/156 | (2006.01) |
| H03K 17/082 | (2006.01) |
| H02H 3/08 | (2006.01) |
| H02M 1/00 | (2006.01) |

(52) U.S. Cl.
CPC ......... *H02H 9/02* (2013.01); *G01R 19/16571* (2013.01); *H02H 1/0007* (2013.01); *H02H 3/08* (2013.01); *H02M 1/32* (2013.01); *H02M 3/156* (2013.01); *H03K 5/084* (2013.01); *H03K 17/0822* (2013.01); *H02M 2001/0009* (2013.01); *H02M 2001/0045* (2013.01); *H02M 2001/325* (2013.01); *H03K 2217/0027* (2013.01)

(58) Field of Classification Search
CPC ............... H02H 9/03; H02H 3/08; H03K 5/08
USPC ............ 327/58; 361/93, 93.9, 195, 200, 205
See application file for complete search history.

(56) References Cited

U.S. PATENT DOCUMENTS

| 2002/0080544 | A1* | 6/2002 | Pellegrino | H02H 3/025 361/93.9 |
|---|---|---|---|---|
| 2005/0122651 | A1* | 6/2005 | Fischer | G06K 19/0701 361/90 |
| 2011/0002069 | A1* | 1/2011 | Yamano | H05B 33/0812 361/18 |
| 2011/0163800 | A1* | 7/2011 | Soma | H03K 17/04123 327/543 |
| 2011/0216468 | A1* | 9/2011 | Easwaran | F42B 3/121 361/247 |
| 2012/0026761 | A1* | 2/2012 | Young | H02M 7/125 363/44 |
| 2015/0138683 | A1* | 5/2015 | Sim | H01H 9/54 361/93.9 |
| 2015/0309090 | A1 | 10/2015 | Akahane | |
| 2016/0154414 | A1* | 6/2016 | Schwerman | G05F 1/56 323/281 |

(Continued)

FOREIGN PATENT DOCUMENTS

WO    2016/136422 A1    9/2016

*Primary Examiner* — Tuan T Dinh

(57) ABSTRACT

A current limiter circuit for limiting current through a pass device is disclosed. The current limiter circuit includes a accurate/fast current limiter circuit, a coarse/slow current limiter control circuit and a pass device having an input port, an output port and an on/off control port. A control circuit couple to the accurate/fast current limiter circuit and the on/off control port is also included. The accurate/fast current limiter circuit is coupled to the input port and the output port and the coarse/slow current limiter control circuit is coupled to the input port and the output port and an on/off control port of the accurate/fast current limiter circuit.

15 Claims, 5 Drawing Sheets

(56) References Cited

U.S. PATENT DOCUMENTS

2018/0034458 A1    2/2018   Tsukamoto et al.

* cited by examiner

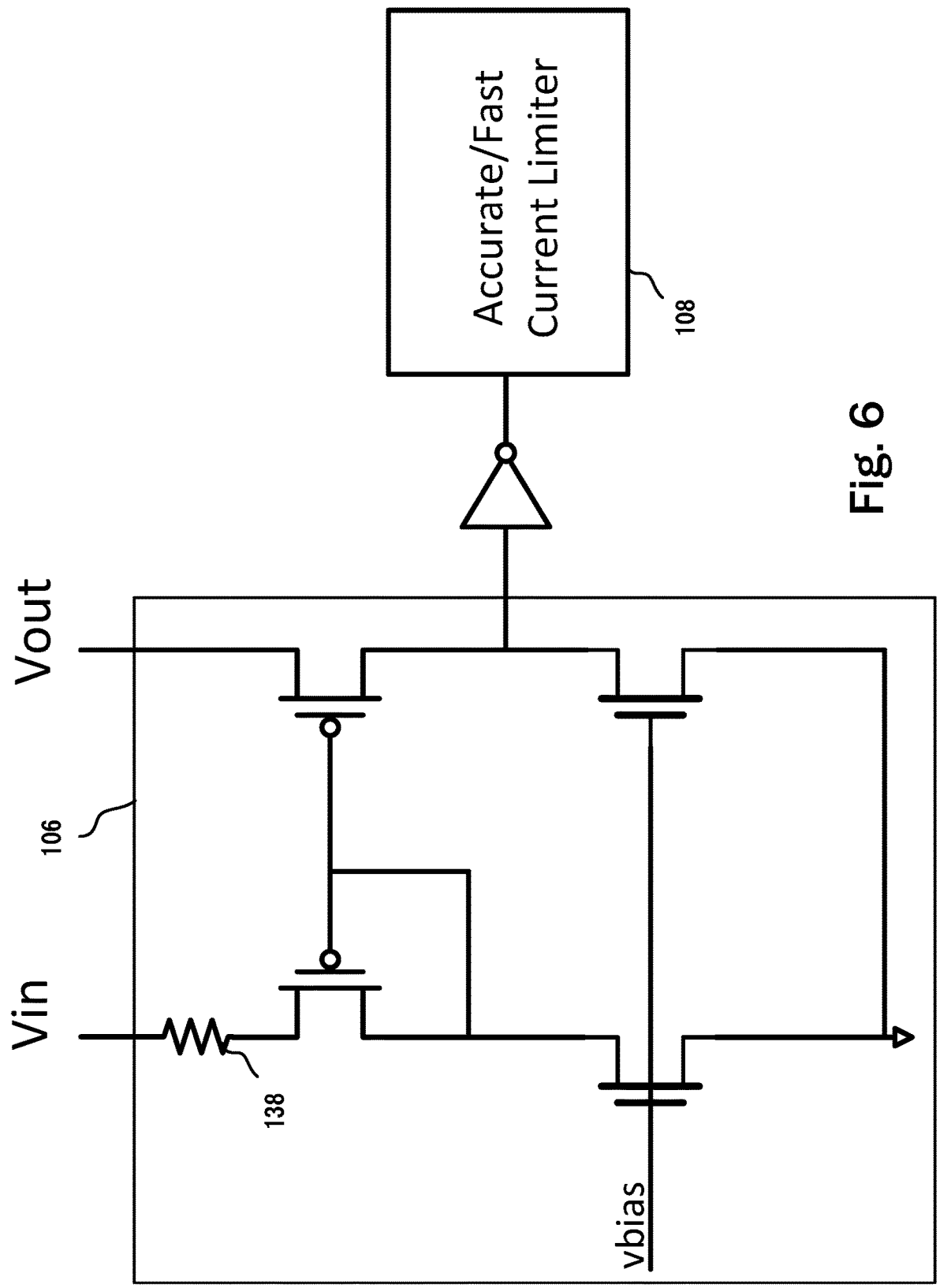

CURRENT LIMITER

BACKGROUND

Current limiting is the practice in electrical or electronic circuits of imposing an upper limit on the current that may be delivered to a load with the purpose of protecting the circuit generating or transmitting the current from harmful effects due to a short-circuit or similar problem in the load.

In addition to protecting the circuit that consumes current, a typical current limiting circuit also reduces power consumption by shutting off a pass device such a transistor when the current passing through the pass device exceeds a predefined threshold or regulates the pass device to keep the current through the pass device at the threshold value.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a current limiter circuit for limiting current through a pass device is disclosed. The current limiter circuit includes a accurate/fast current limiter circuit, a coarse/slow current limiter control circuit and a pass device having an input port, an output port and an on/off control port. A control circuit couple to the accurate/fast current limiter circuit and the on/off control port is also included. The accurate/fast current limiter circuit is coupled to the input port and the output port and the coarse/slow current limiter control circuit is coupled to the input port and the output port and an on/off control port of the accurate/fast current limiter circuit.

In some embodiments, the accurate/fast current limiter circuit is configured to turn off the pass device when the current through the pass device is above a first threshold. Further, the coarse/slow current limiter control circuit is configured to turn ON the accurate/fast current limiter circuit when the current through the pass device is above a second threshold, wherein the second threshold is smaller than the first threshold. The turning off of the accurate/fast current limiter circuit includes cutting off power supply to components of the accurate/fast current limiter circuit. In some examples, accurate/fast current limiter circuit further includes an output control port to drive the control circuit.

In some examples, the output control generates a digital signal that changes state when a current passing through the pass device goes above the first threshold or goes below the first threshold. The coarse/slow current limiter control circuit includes a first switch coupled to the input port, a second switch coupled to the output port. The gates of the first switch and the second switch are coupled to each other. The coarse/slow current limiter control circuit includes a third switch coupled to the first switch and driven by a fixed bias voltage and the bias voltage is set such that when a difference between voltages at the input port and the output port exceeds the bias voltage, the coarse/slow current limiter control circuit generates a control signal to turn on the accurate/fast current limiter circuit.

The coarse/slow current limiter control circuit includes a voltage comparator that compares voltage at the input port and the output port and if a difference between the voltage at the input port and the voltage at the output port is above a predefined voltage threshold, the voltage comparator generates a control signal to turn on the accurate/fast current limiter circuit.

The coarse/slow current limiter control circuit consumes current that is smaller than current consumed, in on state, by the accurate/fast current limiter circuit. This way by keeping the accurate/fast current limiter circuit off when the current passing through the pass device is substantially below the second current threshold as it happens when a load coupled to the pass device is operating in low power mode.

In some embodiments, to ensure that the coarse/slow current limiter control circuit consumes less power than the accurate/fast current limiter circuit, the accurate/fast current limiter circuit operates at a faster response speed than the coarse/slow current limiter control circuit. In some examples, the current limiting circuit also includes a voltage amplifier coupled to the output port, the on/off control port of the pass device and a reference voltage.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

FIG. 6 depicts a schematic of a coarse/slow current limiter control circuit in accordance with one or more embodiments of the present disclosure.

Note that figures are not drawn to scale. Intermediate steps between figure transitions have been omitted so as not to obfuscate the disclosure. Those intermediate steps are known to a person skilled in the art.

DETAILED DESCRIPTION

Many well-known manufacturing steps, components, and connectors have been omitted or not described in details in the description so as not to obfuscate the present disclosure.

Figure 1:
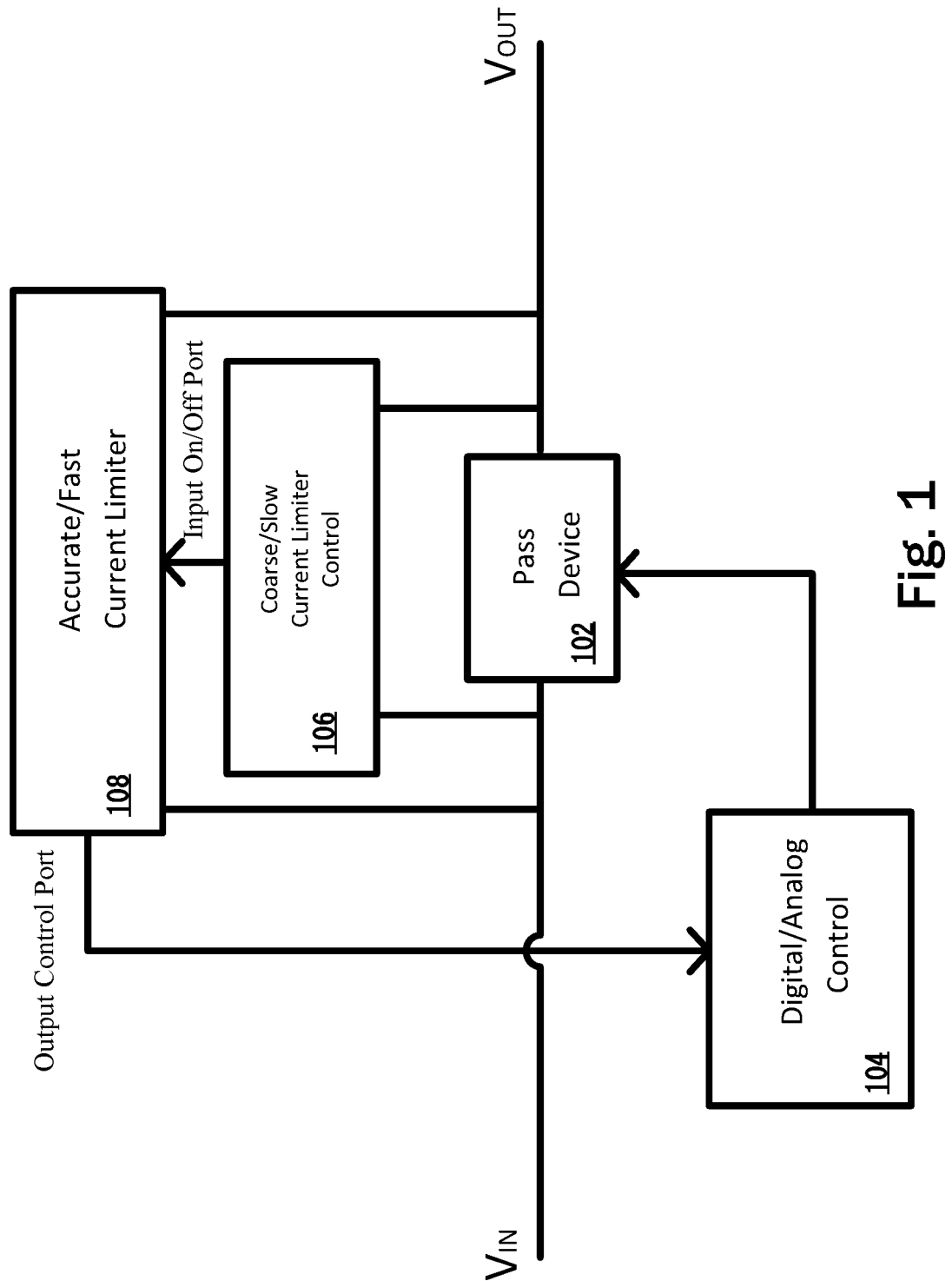
FIG. 1 depicts a conceptual diagram of a current limiting circuit including a accurate/fast current limiter and a coarse/slow current limiter control in accordance with one or more embodiments of the present disclosure.

FIG. 1 depicts a conceptual diagram of a current limiting circuit including a accurate/fast current limiter circuit 108 and a coarse/slow current limiter control circuit 106. The accurate/fast current limiter circuit 108 and the coarse/slow current limiter control circuit 106 are coupled together in parallel across a pass device 102. A digital/analog control circuit 104 is coupled to the gate of the pass device 102 and to a control port of the accurate/fast current limiter circuit 108. In one example, the pass device 102 may be one of the two switching transistors of a power converter or a power supply. By turning on/off the pass device 102, the accurate/fast current limiter circuit 108 can limit the amount of current flowing between the input and the output ports to less than a preselected current value.

The accurate/fast current limiter circuit 108 monitors the current between Vin and Vout ports. The accurate/fast current limiter circuit 108 includes an On/Off port that is coupled to an On/Off switch that is coupled to an input power supply. When On/Off switch is turned off using a control signal at the On/Off port, components of the accurate/fast current limiter circuit 108 do not receive the power to operate.

To effectively and accurately detect current spikes so that the pass device 102 can be switched off using a control signal and the digital/analog control circuit 104, the accurate/fast current limiter circuit 108 must act fast. In one example, the accurate/fast current limiter circuit 108 operates at higher frequency than the operating frequency of the power supply in which the pass device 102 is incorporated in and uses faster switching components that constantly consumes current that, in some examples, may be in the order of over 100 micro amperes.

In some examples, when the current through Vin and Vout is high, for example, in high milli-amperes or more, the current consumed by the accurate/fast current limiter circuit 108 is insignificant. However, during times when a circuit that uses the output voltage Vout is consuming current that is in low milli-amperes or less, the current consumed by the accurate/fast current limiter circuit 108 adds to overall power consumption and higher heat dissipation.

The coarse/slow current limiter control circuit 106 also monitors current passing through the pass device 102. The coarse/slow current limiter control circuit 106 is configured to generate an on/off signal depending upon the amount of current passing through the pass device 102. When the current passing through the pass device 102 is less than a second preselected threshold, the coarse/slow current limiter control circuit 106 generates an OFF signal to turn off the accurate/fast current limiter circuit 108. The second current threshold is less than the preselected current threshold set for the accurate/fast current limiter circuit 108. Similarly, when the current passing through the pass device 102 exceeds the second current threshold, an ON signal is generated to turn on the accurate/fast current limiter circuit 108. This way when the circuit coupled to Vout is not sufficiently loaded, turning off the accurate/fast current limiter circuit 108 reduces the overall power consumption.

To keep the current consumption of the coarse/slow current limiter control circuit 106 low, low operating frequency and low current switches are used. Low current switches tend to react slowly to the changes detected in the current flowing through the pass device 102. However, since the second current threshold is lower than the first current threshold (associated with the accurate/fast current limiter circuit 108), slow detection of changes in current is not detrimental to the safety of the circuit that supply the current because so long as the rise in current from the second threshold to the first threshold is slower than the switching speed of the coarse/slow current limiter control circuit 106. The second threshold is preselected sufficiently lower than the first threshold. For example, if the first threshold is 1 amp, the second threshold may be in the magnitude of milli-amperes so that there is sufficient time between the rise of the current from milliamperes to 1 ampere. The coarse/slow current limiter control circuit 106 is designed using low power components and consumes less power than the accurate/fast current limiter circuit 108 and remains active continuously while causing the accurate/fast current limiter circuit 108, which consumes relatively more power, to turn ON only when the current passing through the pass device 102 exceeds the second current threshold.

In some embodiments, the coarse/slow current limiter control circuit 106 is designed to consume 10 to 100 times less current that is consumed by the accurate/fast current limiter circuit 108 when the accurate/fast current limiter circuit 108 is in ON state.

Figure 2:
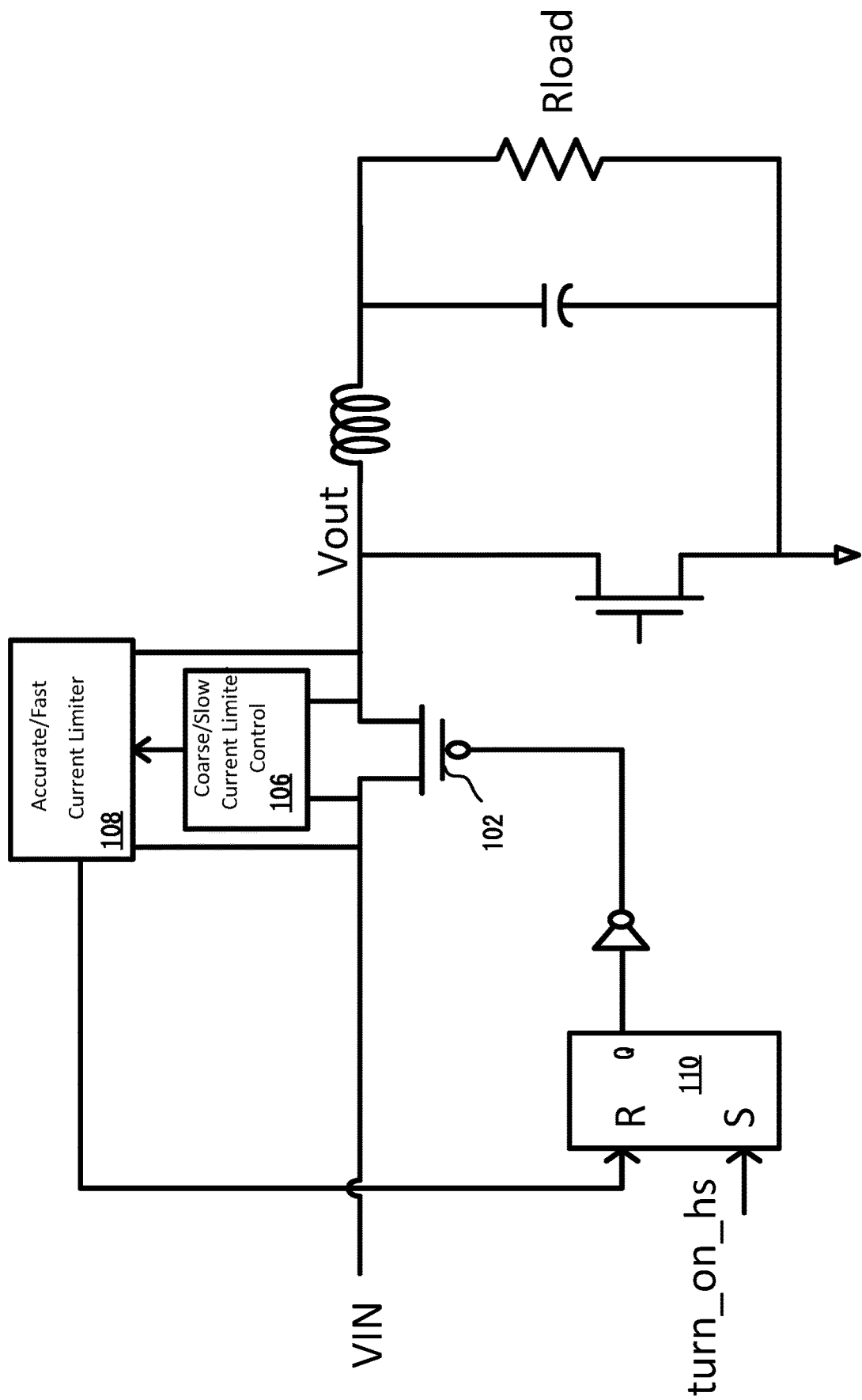
FIG. 2 depicts a schematic of a current limiting circuit in a switching regulator in accordance with one or more embodiments of the present disclosure.

FIG. 2 shows the circuit of FIG. 1 in another embodiment. The components coupled to Vout represent a load that consumes current passing through the pass device 102. The digital/analog control circuit 104 may include a SR latch 110 that may latch the control signal from the accurate/fast current limiter circuit 108 to turn the pass device 102 OFF when the current is larger than the first current threshold. One or more inverters may be used to drive the pass device 102 depending on the type and the size of the pass device 102.

Figure 3:
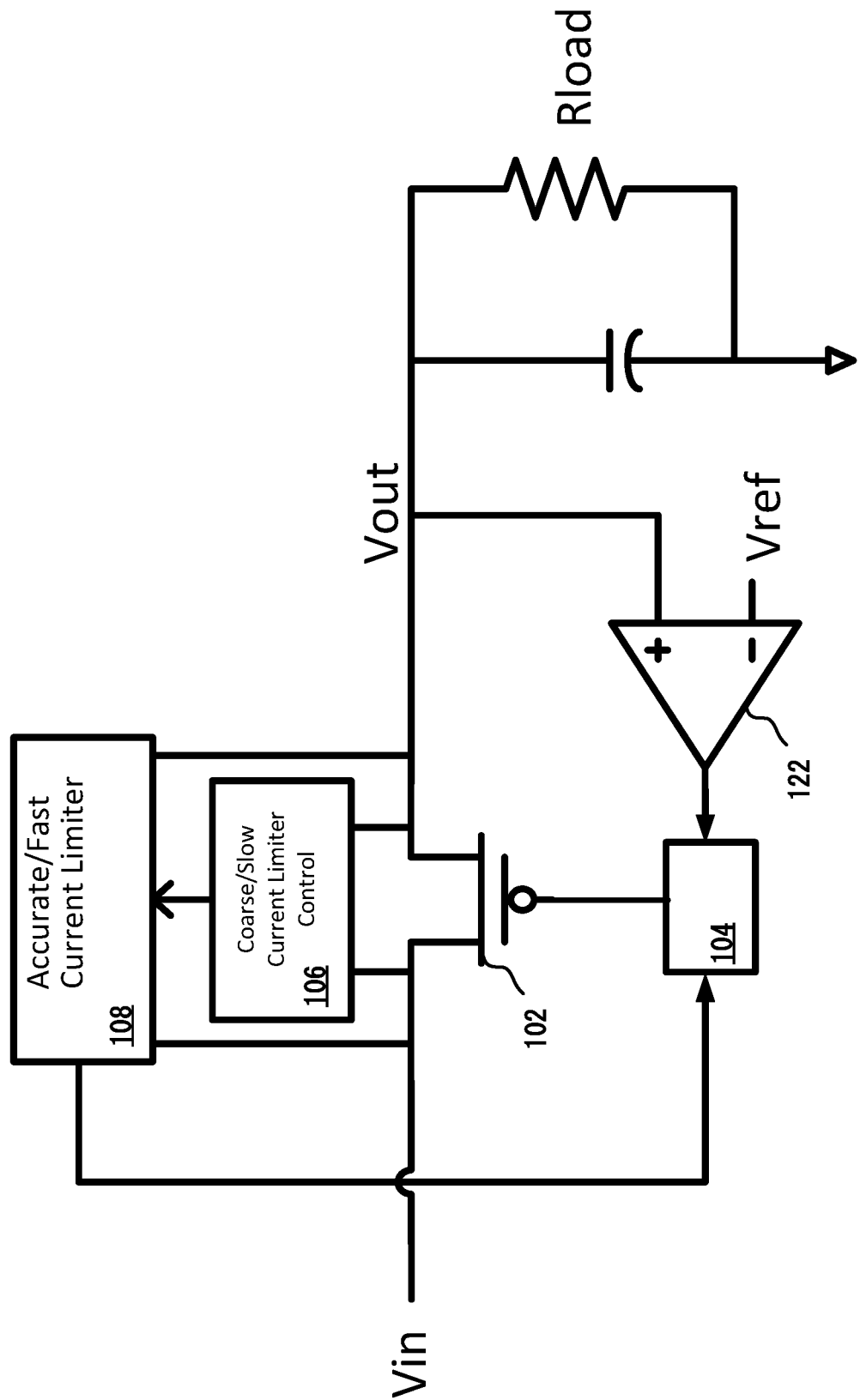
FIG. 3 depicts a schematic of a current limiting circuit in a low dropout regulator (LDO) in accordance with one or more embodiments of the present disclosure.

FIG. 3 shows a current limiting circuit in another example. The current limiting circuit shown in FIG. 3 includes a voltage amplifier 122 in a low dropout regulator (LDO) and is coupled to a reference voltage source Vref and Vout. When the current passing through the pass device 102 exceeds the first threshold, the accurate/fast current limiter circuit 108 provides a control signal to control the pass device 102 to regulate the current through the pass device to be at the first current threshold, until the current goes below the first current threshold again.

Figure 4:
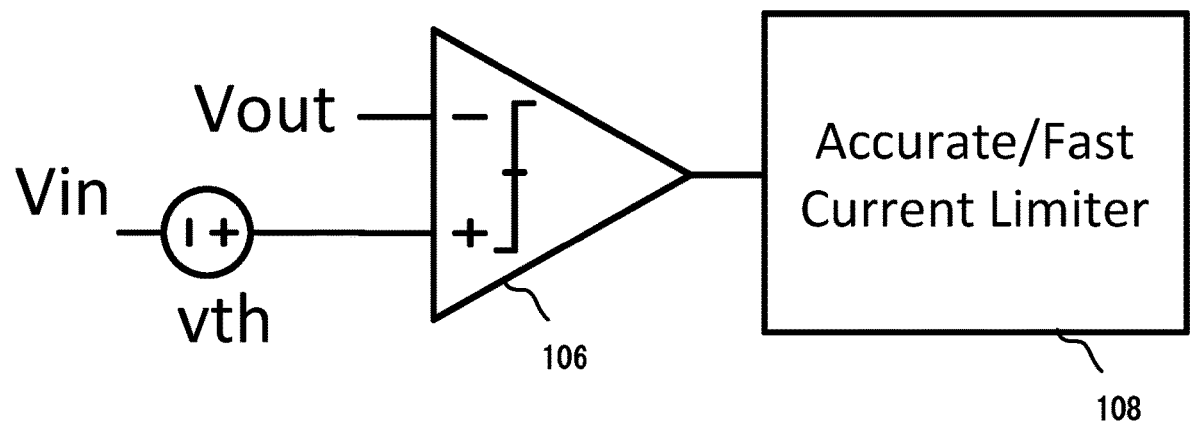
FIG. 4 depicts a schematic of a coarse/slow current limiter control circuit in accordance with one or more embodiments of the present disclosure.

FIG. 4 illustrates a schematic of the coarse/slow current limiter control circuit 106 coupled to the accurate/fast current limiter circuit 108. As stated above, the coarse/slow current limiter control circuit 106 is not required to be accurate and fast responding, in one example, instead of sensing current (which may require relatively complex circuit and consume more power), the coarse/slow current limiter control circuit 106 may be designed using a voltage comparator and if the difference between Vout and Vin is above a selected threshold, the coarse/slow current limiter control circuit 106 generates a control signal to turn on the accurate/fast current limiter circuit 108. Similarly, if the voltage difference is below the threshold, a control signal to turn off the accurate/fast current limiter circuit 108 is generated.

Figure 5:
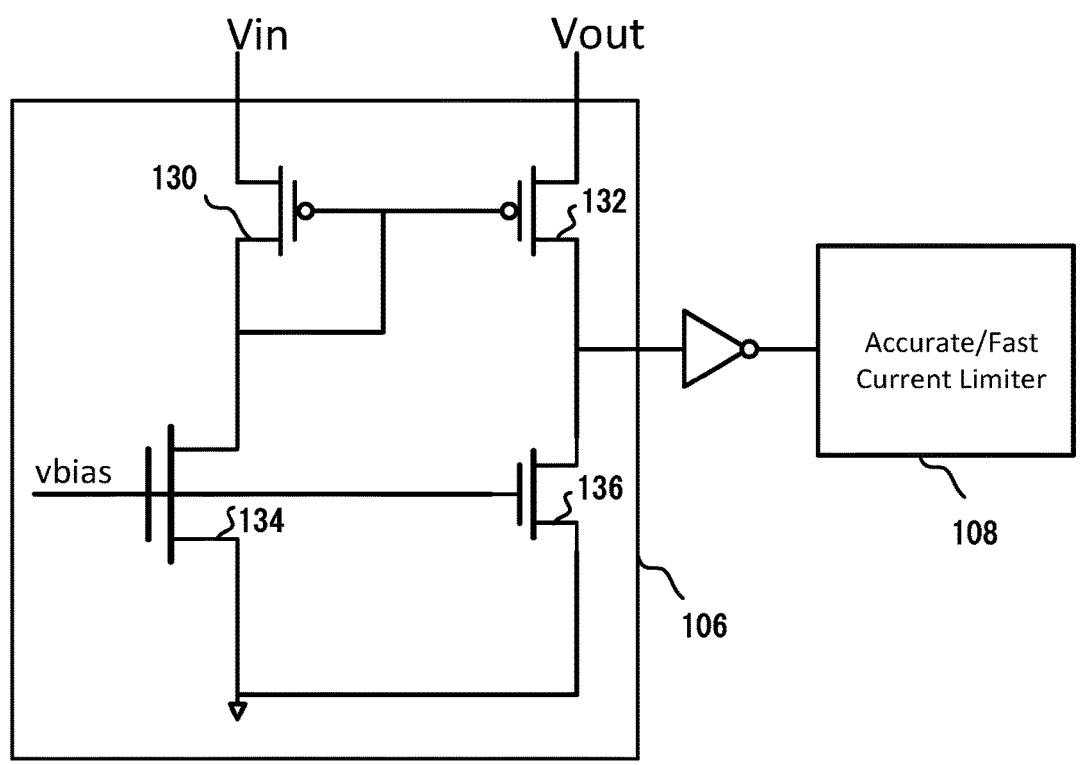
FIG. 5 depicts a schematic of a coarse/slow current limiter control circuit in accordance with one or more embodiments of the present disclosure.

FIG. 5 shows the coarse/slow current limiter control circuit 108 in another embodiment. In this example, the coarse/slow current limiter control circuit 106 includes the transistors 130, 132, 134, 138. The transistor 134 and 136 are driven by the bias voltage Vbias. The size difference between transistor 134 and 136 is selected to create a voltage difference between Vin and Vout that corresponds to the second threshold current. A current can be derived by dividing voltage difference by the On resistance of the pass device 102. The second current threshold can be varied by varying the size difference between transistor 134 and 136. When the voltage difference at Vout and Vin causes the current through the pass device 102 to exceed the second current threshold, the accurate/fast current limiter circuit 108 is turned on.

FIG. 6 illustrates a similar circuit as illustrated in FIG. 5 exception instead of having a Vbias corresponding to the second current threshold, a resistor 138 may be used and the second current threshold can be changed by changing the value of the resistor 138.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A current limiter circuit for limiting current through a pass device, comprising:
    an accurate/fast current limiter circuit including an input on/off port and an output control port;
    a coarse/slow current limiter control circuit;
    a pass device having an input port, an output port and an on/off control port; and
    a control circuit coupled to the accurate/fast current limiter circuit through the output control port and coupled to the on/off control port of the pass device,
    wherein the accurate/fast current limiter circuit is coupled to the input port and the output port; and
    wherein the coarse/slow current limiter control circuit is coupled to the input port and the output port and the input on/off port of the accurate/fast current limiter circuit.

2. The current limiter circuit of claim 1,
    wherein the accurate/fast current limiter circuit is configured to turn off the pass device when a current through the pass device is above a first threshold.

3. The current limiter circuit of claim 1,
    wherein the output control port of the accurate/fast current limiter circuit drives the control circuit.

4. The current limiter circuit of claim 1,
    wherein the coarse/slow current limiter control circuit includes a first switch coupled to the input port, a second switch coupled to the output port.

5. The current limiter circuit of claim 1,
    wherein the coarse/slow current limiter control circuit includes
    a voltage comparator that compares voltage at the input port and the output port and
    if a difference between the voltage at the input port and the voltage at the output port is above a predefined voltage threshold, the voltage comparator generates a control signal to turn on the accurate/fast current limiter circuit.

6. The current limiter circuit of claim 1,
    wherein the coarse/slow current limiter control circuit consumes current that is smaller than current consumed, in on state, by the accurate/fast current limiter circuit.

7. The current limiter circuit of claim 1,
    wherein the accurate/fast current limiter circuit operates at a response speed that is faster than the coarse/slow current limiter control circuit.

8. The current limiter circuit of claim 2,
    wherein the coarse/slow current limiter control circuit is configured to turn on the accurate/fast current limiter circuit, using the input on/off port, when the current through the pass device is above a second threshold, wherein the second threshold is smaller than the first threshold.

9. The current limiter circuit of claim 3,
    wherein the output control generates a digital signal that changes state when a current passing through the pass device goes above the first threshold or goes below the first threshold.

10. The current limiter circuit of claim 4,
    wherein gates of the first switch and the second switch are coupled to each other.

11. The current limiter circuit of claim 4,
    wherein the coarse/slow current limiter control circuit includes a third switch coupled to the first switch and driven by a fixed bias voltage.

12. The current limiter circuit of claim 8,
    wherein the coarse/slow current limiter control circuit is configured to turn off the accurate/fast current limiter circuit, using the input on/off port; and
    wherein turning off of the accurate/fast current limiter circuit includes cutting off power supply to components of the accurate/fast current limiter circuit.

13. The current limiter circuit of claim 11,
wherein the bias voltage is set such that when a difference between voltages at the input port and the output port exceeds the bias voltage, the coarse/slow current limiter control circuit generates a control signal to turn on the accurate/fast current limiter circuit.

14. A current limiter circuit for limiting current through a pass device, comprising:
- an accurate/fast current limiter circuit including a control port;
- a coarse/slow current limiter control circuit;
- a pass device having an input port, an output port and an on/off control port; and
- a control circuit coupled to the accurate/fast current limiter and the on/off control port,
- wherein the accurate/fast current limiter circuit is coupled to the input port and the output port and the coarse/slow current limiter control circuit is coupled to the input port and the output port and the control port of the accurate/fast current limiter circuit;
- wherein the accurate/fast current limiter circuit is configured to turn off the pass device when a current through the pass device is above a first threshold; and
- wherein the coarse/slow current limiter control circuit is configured to turn on the accurate/fast current limiter circuit when the current through the pass device is above a second threshold, wherein the second threshold is smaller than the first threshold.

15. A current limiter circuit for limiting current through a pass device, comprising:
- an accurate/fast current limiter circuit including a control port;
- a coarse/slow current limiter control circuit;
- a pass device having an input port, an output port and an on/off control port; and
- a control circuit coupled to the accurate/fast current limiter and the on/off control port,
- wherein the accurate/fast current limiter circuit is coupled to the input port and the output port and the coarse/slow current limiter control circuit is coupled to the input port and the output port and the control port of the accurate/fast current limiter circuit;
- wherein the coarse/slow current limiter control circuit includes,
  - a voltage comparator that compares voltage at the input port and the output port, and
  - if a difference between the voltage at the input port and the voltage at the output port is above a predefined voltage threshold, the voltage comparator generates a control signal to turn on the accurate/fast current limiter circuit.

* * * * *